United States Patent
Major

(10) Patent No.: US 9,310,701 B2
(45) Date of Patent: Apr. 12, 2016

(54) DEVICE FOR GUIDING ELECTROMAGNETIC RADIATION INTO A PROJECTION EXPOSURE APPARATUS

(75) Inventor: Andras G. Major, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 792 days.

(21) Appl. No.: 13/368,455

(22) Filed: Feb. 8, 2012

(65) Prior Publication Data

US 2012/0212720 A1 Aug. 23, 2012

(30) Foreign Application Priority Data

Feb. 18, 2011 (DE) .......................... 10 2011 004 375

(51) Int. Cl.
*G03B 27/52* (2006.01)
*G03B 27/54* (2006.01)
*G03F 7/20* (2006.01)

(52) U.S. Cl.
CPC ........ *G03F 7/70891* (2013.01); *G03F 7/70883* (2013.01)

(58) Field of Classification Search
CPC ............ G03F 7/70883; G03F 7/70891; G03F 7/70075; G03F 7/70141; G03F 7/7015; G03F 7/70308; G03F 7/7055; G03F 7/70908
USPC ....................... 355/30, 52, 53, 55, 67–71, 77; 250/492.1, 492.2, 492.22, 493.1, 548, 250/504 R
See application file for complete search history.

(56) References Cited

U.S. PATENT DOCUMENTS

| | | | |
|---|---|---|---|
| 5,302,999 A * | 4/1994 | Oshida et al. ...................... 355/1 |
| 6,142,641 A * | 11/2000 | Cohen et al. .................. 359/859 |
| 6,590,698 B1 * | 7/2003 | Ohtsuki et al. ................ 359/326 |
| 2001/0019403 A1 | 9/2001 | Schuster et al. |
| 2004/0033448 A1 * | 2/2004 | Ito et al. ........................ 430/394 |
| 2004/0246457 A1 * | 12/2004 | Okazaki .......................... 355/67 |
| 2005/0027288 A1 * | 2/2005 | Oyagi et al. .................... 606/16 |
| 2006/0244940 A1 | 11/2006 | Uehara |
| 2006/0273263 A1 * | 12/2006 | Raymond et al. .......... 250/492.2 |
| 2008/0212045 A1 * | 9/2008 | Bader ............................. 355/30 |
| 2010/0290020 A1 | 11/2010 | Mori |

FOREIGN PATENT DOCUMENTS

| | | |
|---|---|---|
| DE | 100 00 191 B4 | 7/2001 |
| JP | 63-173322 | 7/1988 |
| JP | 63173322 A * | 7/1988 |

(Continued)

OTHER PUBLICATIONS

English translation of Japanese Office Action for corresponding JP Appl No. 2012-022761, dated Apr. 17, 2012.

(Continued)

*Primary Examiner* — Christina Riddle
(74) *Attorney, Agent, or Firm* — Fish & Richardson P.C.

(57) ABSTRACT

A device for guiding electromagnetic radiation into a projection exposure apparatus for semiconductor lithography includes an optical fiber and an actuator for the mechanical manipulation of a section of the fiber as a result of which a temporally averaged homogenization of an intensity profile of electromagnetic radiation emerging at an exit end of the fiber can be achieved. A projection exposure apparatus for semiconductor lithography is equipped with the abovementioned device.

18 Claims, 3 Drawing Sheets

(56) References Cited

FOREIGN PATENT DOCUMENTS

| | | |
|---|---|---|
| JP | 2001-196305 | 7/2001 |
| JP | 2010-171447 | 8/2010 |
| JP | 2010-267966 | 11/2010 |

OTHER PUBLICATIONS

German Office Action, with English translation, for corresponding DE Appl No. 10 2011 004 375.6, dated Sep. 12, 2011.

* cited by examiner

DEVICE FOR GUIDING ELECTROMAGNETIC RADIATION INTO A PROJECTION EXPOSURE APPARATUS

CROSS-REFERENCE TO RELATED APPLICATIONS

This application claims benefit under 35 U.S.C. §119 to German Application No. 10 2011 004 375.6, filed on Feb. 18, 2011. The content of this application is hereby incorporated by reference in its entirety.

BACKGROUND

The disclosure relates to a device for guiding electromagnetic radiation with an optical fibre, wherein the fibre is introduced into a projection exposure apparatus for semiconductor lithography.

Projection exposure apparatuses for semiconductor lithography contain, inter alia, optical elements for optically influencing the EUV or VUV radiation used for imaging. In order to improve the optical ray guiding and the optical imaging performance, the optical elements can in part also be heated, for example in order to homogenize a temperature distribution across the relevant optical element and thus to prevent undesired, temperature-induced deformations of the optical element. By way of example, electromagnetic infrared radiation (for short: IR radiation) can be used for heating the optical elements. In this case, the IR radiation impinges on the optical element, is partly absorbed there and heats said element as a consequence. It can be advantageous to guide the electromagnetic radiation using an optical fibre from the outside into the EUV projection exposure apparatus, the infrared radiation source being situated outside the EUV projection exposure apparatus. The waste heat from the light source can thus be dissipated separately and an additional, undesired energy input into the EUV projection exposure apparatus by the waste heat from the light source is avoided by the use of the fibre. By way of example, a fibre-coupled laser that emits infrared radiation can be used as a radiation source. The optical fibre proceeding from the laser is generally embodied as a single-mode fibre. In order to transport high radiation powers from the output of the light source fibre to the location of the optical element to be heated, a further optical fibre, e.g. a multimode fibre, is used.

At the exit end of the optical fibre that leads to the optical element in the projection exposure apparatus, an inhomogeneous intensity profile distribution of the electromagnetic radiation can be present. Given a lack of homogeneity, rotational symmetry of the radiation distribution with respect to the centre of the fibre cross section is not present. In particular, cases can occur in which the centroid of the intensity profile distribution is situated eccentrically with respect to the fibre cross section. These inhomogeneous distributions of the electromagnetic radiation at the exit end of the fibre have the disadvantage that there impinges on the optical elements in the projection exposure apparatus an electromagnetic radiation which results in an undesired heating of the optical element on account of an incorrect spatially resolved distribution. A correct heating of the optical elements is facilitated, in particular, when the intensity profile distribution at the exit end of the fibre is homogeneous.

SUMMARY

Embodiments are disclosed that feature homogenizing the intensity profile distribution at the exit end of the fibre.

This can be achieved using the devices including the features disclosed herein.

Embodiments of devices for guiding the electromagnetic radiation into a projection exposure apparatus for semiconductor lithography have, inter alia, an optical fibre. Said optical fibre serves for transporting the electromagnetic radiation to the optical element in the projection exposure apparatus. For the mechanical manipulation of a section of the fibre, an actuator is provided, as a result of which a temporally averaged homogenization of an intensity profile of electromagnetic radiation emerging at an exit end of the fibre can be achieved. An intensity profile is homogeneous if it is rotationally symmetrical with respect to the centre of the fibre cross section at the exit end of the fibre. In this case, the homogenization is effected using a temporal averaging. The mechanical manipulation of the optical fibre can be carried out repeatedly in a specific time segment. The projection exposure apparatus can be, in particular, an EUV projection exposure apparatus. In this case, the electromagnetic radiation serves for heating an optical element in the apparatus. The electromagnetic radiation can be, for example, in the range of the wavelengths of 1064 nm or 1550 nm. A fibre laser can be present as a source of the electromagnetic radiation; the fibre can be a multimode fibre having a stepped-index profile. The actuator can be suitable, in particular, for causing a section of the fibre to effect a lateral movement or for reversibly altering the fibre cross section on a section of the fibre. The section for the mechanical manipulation of the fibre can be either within or outside the projection exposure apparatus.

As an alternative or in addition to the possibilities outlined above, a homogenization of the intensity profile of the radiation can also be achieved by the use of a diffusing screen.

BRIEF DESCRIPTION OF THE DRAWINGS

An exemplary embodiment of the disclosure is explained in greater detail below with reference to the drawing, in which.

DETAILED DESCRIPTION

Figure 1:
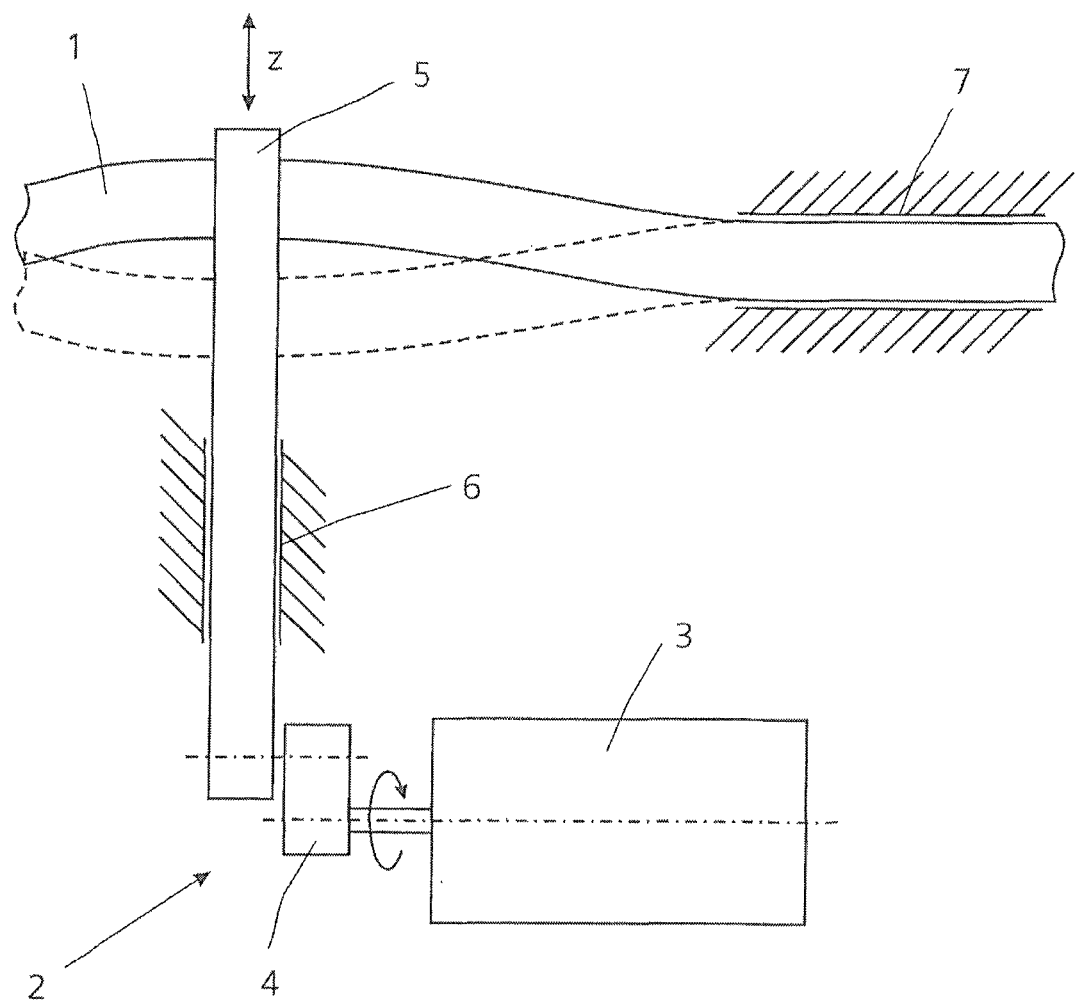
FIG. 1 shows an optical multimode fibre in a section in which the fibre is moved laterally by an actuator.
Figure 2:
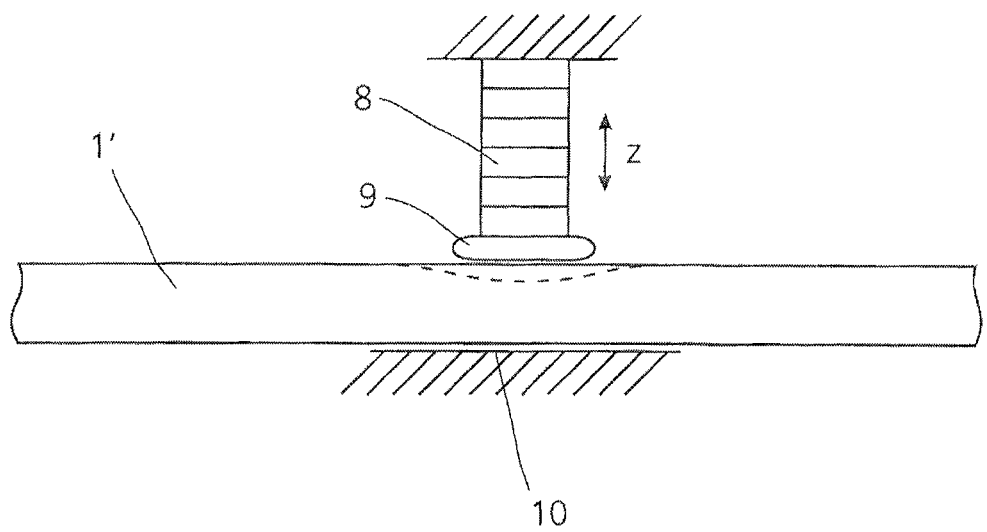
FIG. 2 shows an optical multimode fibre in a section in which the cross section of the fibre is changed by an actuator.

The exemplary embodiment illustrated in FIGS. 1 and 2 describes an optical multimode fibre that serves for transporting IR radiation into an EUV projection system. The IR radiation is used there for heating an optical element. The multimode fibre 1 illustrated has a stepped-index profile, for example, other refractive index distributions over the fibre cross section also being possible. The IR radiation is coupled in, e.g., using a fibre-coupled IR laser (not illustrated in the figures), the coupling-in and the connection of an optical output fibre of the laser and the multimode fibre not being illustrated in more specific detail in FIGS. 1 and 2. Depending on the coupling-in of the IR radiation and depending on the propagation conditions in the optical multimode fibre, different propagation modes of the IR radiation can form in said fibre. The exit end of the optical multimode fibre is not depicted in further detail in the figures either. The fibre 1 can have overall e.g. a length of between 3 meters and 30 meters.

An actuator 2 is arranged in that section of the optical multimode fibre 1 which is shown in FIG. 1. Said actuator 2, which is embodied here as a rotary motor 3 with an eccentric 4 and a lifting rod 5 serves to move the fibre 1 substantially transversely with respect to the longitudinal direction of the fibre 1, i.e., laterally. The eccentric 4 is connected to the fibre 1 via the lifting rod 5. The lifting rod 5 is held laterally by a guide 6. The lifting rod 5 moves during rotation of the eccentric in the z-direction, indicated using an arrow in the figure. The lifting rod 5 is connected to the fibre 1 in such a way that the fibre 1 follows the movement of the lifting rod 5. In FIG. 1, the dashed illustration of the fibre 1 shows a deflected position of the fibre 1 e.g. at the lower turning point of the lifting rod 5. A mount 7 is fitted at a distance from said lifting rod 5, said mount holding the fibre 1 is a positionally fixed manner there. If the section of the fibre 1 shown here is moved laterally, this results in a different geometrical course of the fibre particularly in the section between the lifting rod 5 situated at the fibre 1 and the mount 7. This movement thus results in a geometrical change in the course of the fibre, which need not necessarily be repeated periodically, but rather can also be random. The amplitude during the lateral movement of the fibre 1 can be, for example, only a few millimeters. In the case of this change in geometry, the IR radiation in the fibre 1 can experience a deflection, such that the mode structure in the fibre 1 can respectively change. This change in the mode structure in the section of the fibre 1 shown can also result in a change in the intensity profile at the exit end. Given suitable movement of the fibre section between the fixed lifting rod 5 and the mount 7, an intensity distribution that is distributed homogenously or symmetrically over the cross section of the multimode fibre 1 arises in the case of a temporally integral consideration at the exit end. In this case, the frequency of the movement can be, for example, in a range of 0.1-100 Hz; the amplitude can be, in particular, between 0.1 and 50 mm. Consequently, it is possible to realize a spatially homogenized or else spatially defined heating of the optical element to be heated.

FIG. 2 illustrates a section having a different optical fibre 1', wherein the cross section of the fibre 1' can be locally changed temporally. The optical fibre 1' can, for example, likewise be a commercially available multimode fibre having a stepped-index profile. An actuator 8 is arranged in that section of the fibre 1' which is shown here, said actuator serving for deforming the cross section of the fibre 1' over time. The deformed section of the fibre 1' is indicated in dashed fashion in FIG. 2. Various actuator principles can be used. These also include, for example, an actuator according to the piezoelectric principle, as illustrated in FIG. 2. A stamp 9 is fitted to the actuator 8 and transmits the movement of the actuator 8 to the fibre 1'. The stamp 9 presses the fibre 1' against the support 10. The actuator 8 carries out a comparatively rapid periodic movement in the z-direction. The frequency of the movement can be several hertz, for example. As a result of the change in the fibre cross section, the refractive index can also be changed locally. The change in the cross section and/or in the refractive index can lead to a change in the mode propagation in the fibre 1'. For transmitting the force to the fibre cross section, it is also possible to employ additional mechanical mechanisms such as, e.g., a lever or tongs that compress the fibre from both sides.

Figure 3:
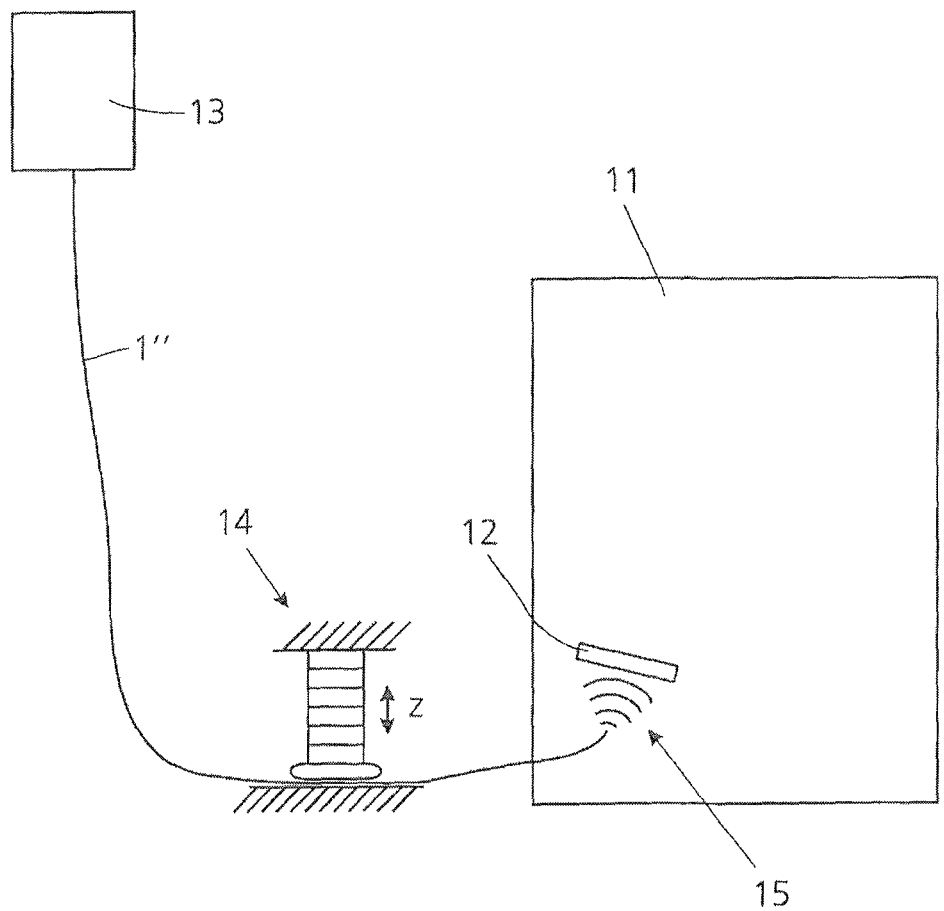
FIG. 3 shows a projection exposure apparatus for semiconductor lithography with an inserted optical fibre.

FIG. 3 schematically illustrates a projection exposure apparatus 11 for semiconductor lithography, into which the fibre 1" has been inserted. In addition, an optical element 12 is also depicted by way of example in the projection exposure apparatus 11, which optical element is used for influencing the EUV beam path and can be a deflection mirror, for example. In the exemplary embodiment shown, an IR fibre laser 13 is used as a light source. In the optical fibre 1", the infrared radiation is guided to the optical element 12. In a section of the fibre 1", a mechanical manipulation of the fibre 1" is performed using an actuator 14. The actuator shown in FIG. 3 carries out a reversible change in the fibre cross section. In the case of this mechanical manipulation, the intensity radiation distribution at the exit end of the optical fibre 1" is homogenized, the homogenization being effected by temporal averaging. The mechanical manipulation by the actuator 14 is carried out repeatedly in this time. The IR radiation 15 emerging from the fibre 1" impinges on the optical element 12 and heats the latter as a consequence.

Other embodiments are in the following claims.

What is claimed is:

1. A device for guiding electromagnetic radiation into a projection exposure apparatus for semiconductor lithography, comprising:
an individual optical fibre; and
an actuator arranged for the mechanical manipulation of a section of the individual optical fibre such that a temporally averaged homogenization of an intensity profile of electromagnetic radiation emerging at an exit end of the individual optical fibre is achieved,
wherein:
the device is configured so that, during use of the device, the electromagnetic radiation emerging at the exit end of the individual optical fibre heats an optical element of the projection exposure apparatus without being imaged by the projection exposure apparatus; and
the actuator is arranged to reversibly alter a diameter of the section of the individual optical fibre.

2. The device of claim 1, wherein the projection exposure apparatus is an EUV projection exposure apparatus.

3. The device of claim 1, wherein the electromagnetic radiation is in a range of the wavelengths of 1064 nm or 1550 nm.

4. The device of claim 1, wherein a fibre laser is a source of the electromagnetic radiation.

5. The device of claim 1, wherein the individual optical fibre is a multimode fibre having a stepped-index profile.

6. The device of claim 1, wherein the actuator is arranged to cause the section of the individual optical fibre to move laterally.

7. A projection exposure apparatus for semiconductor lithography comprising a device according to claim 1.

8. The device of claim 1, wherein the projection exposure apparatus is configured to image EUV electromagnetic radiation.

9. The device of claim 8, wherein, during use of the device, the electromagnetic radiation emerging at the exit end of the individual optical fibre is infrared radiation.

10. A device, comprising:
an individual optical fibre; and
an actuator configured to mechanically manipulate a section of the individual optical fibre so that, during use of the device, a temporally averaged homogenization of an intensity profile of electromagnetic radiation emerges at an exit end of the individual optical fibre,
wherein:
the device is configured so that, during use of the device, the electromagnetic radiation emerging at the exit end of the individual optical fibre: a) heats an optical element in a projection exposure apparatus; and b) is not imaged by the projection exposure apparatus; and
the actuator is arranged to reversibly alter a diameter of the section of the individual optical fibre.

11. The device of claim 10, wherein, during use of the device, the electromagnetic radiation emerging at the exit end of the individual optical fibre is infrared radiation.

12. The device of claim 10, wherein, during use of the device, the electromagnetic radiation emerging at the exit end of the individual optical fibre is in a range of the wavelengths of 1064 nm or 1550 nm.

13. The device of claim 10, further comprising a fibre laser configured to generate the electromagnetic radiation.

14. The device of claim 10, wherein the individual optical fibre is a multimode fibre having a stepped-index profile.

15. The device of claim 10, wherein the actuator is configured to cause a section of the individual optical fibre to move laterally.

16. An apparatus, comprising:
an optical element; and
a device comprising:
an individual optical fibre; and
an actuator configured to mechanically manipulate a section of the individual optical fibre so that, during use of the device, a temporally averaged homogenization of an intensity profile of electromagnetic radiation emerges at an exit end of the individual optical fibre,
wherein:
the device is configured so that, during use of the device, the electromagnetic radiation emerging at the exit end of the individual optical fibre heats the optical element without being imaged by the apparatus;
the actuator is arranged to reversibly alter a diameter of the section of the individual optical fibre; and
the apparatus is a projection exposure apparatus.

17. The apparatus of claim 16, wherein the apparatus is an EUV projection exposure apparatus.

18. The apparatus of claim 17, wherein, during use of the device, the electromagnetic radiation emerging at the exit end of the individual optical fibre is infrared radiation.

* * * * *